United States Patent [19]

Petropoulos et al.

[11] 3,859,099

[45] Jan. 7, 1975

[54] POSITIVE PLATE INCORPORATING DIAZOQUINONE

[75] Inventors: Constantine C. Petropoulos, Webster; Joseph A. Arcesi; Raymond W. Ryan, both of Rochester, all of N.Y.

[73] Assignee: Eastman Kodak Company, Rochester, N.Y.

[22] Filed: Dec. 6, 1973

[21] Appl. No.: 422,374

Related U.S. Application Data

[63] Continuation-in-part of Ser. No. 317,585, Dec. 22, 1972, abandoned.

[52] U.S. Cl. .................. 96/90 R, 96/33, 96/35.1, 96/91 D, 96/115 R, 204/159.11, 204/159.16, 260/80.81

[51] Int. Cl. ......... G03f 7/08, G03c 1/54, G03c 1/72

[58] Field of Search ...... 96/91 D, 33, 115 R, 115 P; 204/159.11, 159.16

[56] References Cited

UNITED STATES PATENTS

| | | | |
|---|---|---|---|
| 3,418,295 | 12/1968 | Schoenthaler | 96/115 R |
| 3,502,470 | 3/1970 | Delzenne et al. | 96/91 D |
| 3,533,796 | 10/1970 | Lassig et al. | 96/91 D |
| 3,551,154 | 12/1970 | DiBlas et al. | 96/91 D |
| 3,592,646 | 7/1971 | Holstead et al. | 96/91 D |
| 3,597,202 | 8/1971 | Cerwinka | 96/115 P |
| 3,620,736 | 11/1971 | Tarkington | 96/91 D |
| 3,644,118 | 2/1972 | Agnihotri | 96/91 D |
| 3,647,443 | 3/1972 | Rouner et al. | 96/91 D |
| 3,669,658 | 6/1972 | Yonezawa et al. | 96/91 D |
| 3,748,132 | 7/1973 | Arcesi et al. | 96/115 P |
| 3,759,711 | 9/1973 | Rauner et al. | 96/33 |

FOREIGN PATENTS OR APPLICATIONS

| | | | |
|---|---|---|---|
| 1,267,005 | 3/1972 | Great Britain | 96/91 D |

*Primary Examiner*—Charles L. Bowers, Jr.
*Attorney, Agent, or Firm*—A. H. Rosenstein

[57] ABSTRACT

A radiation-sensitive polymer is disclosed useful in forming positive working lithographic plates of exceptional wear, printing and developability characteristics. The radiation-sensitive polymers are copolymers of alkyl acrylate, acryloyloxyalkyl quinone diazide acid ester and acryloyloxyalkyl carboxylate repeating units, with up to 4 percent of the repeating units optionally being hydroxyalkyl acrylate units.

36 Claims, No Drawings

POSITIVE PLATE INCORPORATING DIAZOQUINONE

This is a continuation-in-part of application Ser. No. 317,585 filed Dec. 22, 1972.

This invention relates to an improved positive printing plate incorporating as a radiation-sensitive element a polymeric diazoquinone. In another aspect this invention relates to a novel polymeric diazoquinone useful in printing plates and in photoresist compositions.

DuPont British Pat. No. 1,267,005, published Mar. 15, 1972, teaches substantially completely esterifying a copolymer of methyl methacrylate and hydroxyethyl methacrylate with a large excess of 2-diazo-1-naphthol-4-sulfonyl chloride to produce positive reliefs and photoresists. Presumably substantially complete esterification of the hydroxyl groups is considered necessary, since it is well known in the art that diazoquinone polymers containing pendant hydroxyl groups can be crosslinked on exposure. It is believed that free non-phenolic hydroxyl groups ineract with the ketene or carboxylic acid groups formed by the diazoquinone groups on exposure to provide crosslinking sites. Illustrative of such teaching is Delzenne et al. U.S. Pat. No. 3,502,470 issued Mar. 24, 1970.

Applicants have observed that some copolymers of methyl methacrylate and hydroxyethyl methacrylate esterified with 2-diazo-1-naphthol-4-sulfonyl chloride produce positive printing plates of poor wear characteristics. The proportion of methyl methacrylate must be at least 75 percent to achieve fair wear characteristics and for best wear characteristics about 80 percent methyl methacrylate is preferred. Wear characteristics are not improved by controlling esterification so that free hydroxyl groups remain in the light-sensitive polymer. At the same time, if as few as one tenth of the hydroxyl groups are unesterified, a noticeable scumming of the printing plate is observed in use.

It is an object of this invention to provide an improved positive printing plate having long wear characteristics, which is notably free of scumming and which has good developability characteristics.

It is another object to provide a novel composition useful in forming such printing plates. It is a more specific object to provide such a composition which does not require the use of a large excess of a diazoquinone reactant in its formation and which does not require that its pendant hydroxyl groups be substantially completely esterified with a diazoquinone.

It is known in the art to form radiation-sensitive elements which are capable of producing positive images upon exposure to actinic radiation and subsequent treatment with a basic solution. While it is further known in the art to use radiation-sensitive methacrylic vinyl copolymers in such photosensitive elements, Applicants have quite unexpectedly discovered a novel radiation-sensitive acrylic vinyl copolymer that offers an unusual and unexpected combination of advantages in that it is readily developable to produce good images and, at the same time, is resistant to scumming and wear when used to form the printing image in a positive printing plate.

In one aspect this invention is directed to a radiation-sensitive element capable of producing a positive image upon exposure to actinic radiation and subsequent treatment with a basic solution. The element is comprised of a support bearing a radiation-sensitive acrylic vinyl copolymer. On a mole basis, at least 75 percent of the repeating units of the copolymer are alkyl acrylate units, and, in addition, from 10 to 22 percent of said repeating units are acryloyloxyalkyl quinone diazide acid ester units, from 1 to 7 percent of said repeating units are acryloyloxyalkyl carboxylate units and up to 4 percent of said repeating units can be hydroxyalkyl acrylate units.

In another aspect this invention is directed to a novel composition of matter having unexpectedly useful properties.

As employed in this application the terms "acrylic" and "acrylate" bear a genus to species relationship to the corresponding methacrylic and methacrylate structures, except, of course, in the naming of individual compounds. Also, all percentages, except as specifically designated to the contrary, are on a molar basis. The term "positive" as applied to positive printing plates refers to those plates which accept an oleophilic ink in unexposed areas.

The radiation-sensitive acrylic vinyl copolymers of this invention are formed by the addition polymerization of acrylic monomers. As herein employed references to various acrylic repeating units is intended to designate repeating units formed by the addition polymerization of acrylic monomers. At least 75 percent and, preferably, at least 78 percent of the repeating units are alkyl acrylate units, such as the alkyl acrylate repeating units I (I)

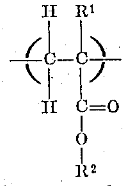

in which $R^1$ is methyl or hydrogen and $R^2$ is an alkyl radical having from 1 to 6 carbon atoms. It is Applicants' discovery that this high proportion of lower alkyl acrylate ester repeating units imparts desirable wear characteristics to produce long running printing plates—that is, printing plates that are intended to yield at least 100,000 printing impressions in normal use with little or no observable degradation of the resultant printed image. Exemplary of compounds useful in forming repeating units I are methyl methacrylate, ethyl methacrylate, n-propyl acrylate, n-butyl methacrylate, t-butyl acrylate, isoamyl methacrylate, cyclohexyl methacrylate, n-hexyl methacrylate, and the like.

The remainder of the acrylic repeating units are esterified to form hydroxyalkyl acrylate repeating units which are, for the most part, further esterified. To impart radiationsensitivity, from 10 to 22 percent of the repeating units of the copolymer are further esterified with an acid quinone diazide—such as ortho or paraquinone diazide sulfonic acid or ortho or para quinone diazide carboxylic acid, for example. The radiationsensitive repeating units can take the form of repeating units II (II)

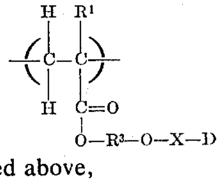

in which $R^1$ is as defined above, $R^3$ is an alkylene radical having from 2 to 6 carbon atoms, O-X is an acid ester group, such as a sulfonyl

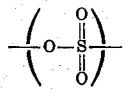

group or a carboxyl

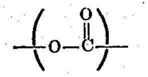

group and

D is a quinone diazide group.

Units conforming to this structure which are useful in the polymers of the present invention include 2-methacryloyloxyethyl o-quinone diazide sulfonate, 2-methacryloyloxyethyl o-quinone diazide carboxylate, 2-methacryloyloxyethyl p-quinone diazide sulfonate,
2-acryloyloxyethyl o-quinone diazide sulfonate,
2-methacryloyloxyethyl p-quinone diazide carboxylate,
2-acryloyloxyethyl p-quinone diazide sulfonate,
3-acryloyloxypropyl o-quinone diazide sulfonate,
3-methacryloyloxypropyl o-quinone diazide carboxylate,
4-methacryloyloxybutyl o-quinone diazide sulfonate,
4-acryloyloxybutyl p-quinone diazide carboxylate,
5-methacryloyloxyamyl o-quinone diazide sulfonate,
6-methacryloyloxyhexyl o-quinone diazide carboxylate, and the like.

The quinone diazide moieties which are useful in the polymers of this invention can differ in their constitution very widely, provided they contain at least one light-sensitive quinone diazide moiety. Especially advantageous are o-quinone diazides of the benzene series carrying one or more o-quinone diazide groupings, such as o-benzoquinone diazide, 1,2-naphthoquinone-1-diazide, 1,2-naphthoquinone-2-diazide, 7-methoxy-1,2-naphthoquinone-2-diazide, 6-nitro-1,2-naphthoquinone-2-diazide, 5-(carboxymethyl)-1,2-naphthoquinone 1-diazide, 2,3-phenanthrene-quinone-2-diazide, 9,10-phenanthrenequinone-10-diazide and 3,4-chrysenequinone-3-diazide.

It is Applicants' discovery that if from 1 to 7 percent of the repeating units of the acrylic copolymer are hydroxyalkyl acrylate repeating units that are further esterified with a carboxylic acid an unexpected improvement in developability is imparted to these copolymers in printing plate and photoresist applications. Additionally, another unexpected improvement in properties is provided in that printing plates formed from these copolymers exhibit little or no tendency toward scumming even when up to 4 percent of the repeating units of the copolymer are made up of hydroxylalkyl acrylate repeating units. By the incorporation of acryloyloxyalkyl carboxylate repeating units in the acrylic copolymer it is no longer necessary to achieve substantially complete esterification of the hydroxyalkyl acrylate repeating units with a quinone diazide acid, as has previously been considered necessary in the art. This in turn makes it possible to refrain from using large excess quantities of the quinone diazide acid in copolymer preparations. The acryloyloxyalkyl carboxylate repeating units can take the form of repeating units III (III)

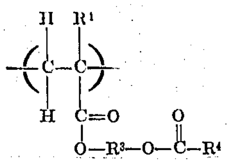

in which $R^1$ and $R^3$ are as defined above and $R^4$ is a hydrocarbon or halohydrocarbon having up to about 20 carbon atoms and, preferably, 10 or fewer carbon atoms.

Typical of acryloyloxyalkyl carboxylate repeating units III are 2-methacryloyloxyethyl acetate, 2-methacryloyloxyethyl propionate, 2-acryloyloxyethyl butyrate, 2-methacryloyloxyethyl caproate, 2-methacryloyloxyethyl myristate, 2-methacryloyloxyethyl benzoate, 2-acryloyloxyethyl alphanaphthoate, 3-acryloyloxypropyl stearate, 3-acryloyloxypropyl acetate, 3-methacryloyloxypropyl caprylate, 3-acryloyloxypropyl arachidate, 4-acryloyloxybutyl acetate, 4-methacryloyloxybutyl butyrate, 4-acryloyloxybutyl laurate, 4-methacryloyloxybutyl benzoate, 6-methacryloyloxyhexyl acetate, 6-methacryloyloxyhexyl butyrate, 6-acryloyloxyhexyl stearate, 6-acryloyloxyhexyl benzoate. It is, of course, recognized that halogenated carboxylic acids can be incorporated. For example, in place of acetic acid fluoroacetic, chloroacetic, bromoacetic, iodoacetic, dichloroacetic, trichloroacetic and similar known halogenated acetic acids can be employed. Other exemplary useful halogenated carboxylic acids include alpha-chloropropionic acid, beta-chloropropionic acid, 4-iodobutyric acid, p-bromobenzoic acid, and the like.

As noted above, it is not necessary to utilize an excess of the comparatively expensive quinone diazide reactant to assure substantially complete esterification of all hydroxyalkyl acrylate repeating units. It is an unexpected advantage of this invention that the light-sensitive acrylic copolymer can incorporate up to 4 percent hydroxyalkyl acrylate repeating units without adverse effect on the ink retention properties of the copolymer. Thus, in addition to repeating units I, II and III the copolymer can additionally include repeating units IV (IV)

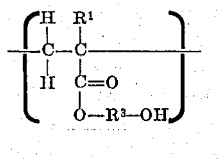

in which $R^1$ and $R^3$ are as previously defined.

Typical of compounds useful in forming repeating units IV (hence the parent compounds for repeating units II and III also) are 2-hydroxyethyl methacrylate, 2-hydroxypropyl acrylate, 3-hydroxypropyl methacrylate, 5-hydroxypentyl acrylate, 6-hydroxyhexyl acrylate, 2-hydroxyhexyl methacrylate and the like.

The radiation-sensitive acrylic copolymers of this invention can be prepared by any one of a variety of vinyl polymerization techniques known to those skilled in the art. For example, bulk, solution, bead or emulsion polymerization occurs readily in the presence of a polymerization initiator. The copolymer can be formed by first reacting alkyl acrylates as in repeating units I and hydroxyalkyl acrylates as in repeating units IV to form a copolymer consisting essentially of repeating units I and IV. Thereafter the free hydroxyl units provided by the repeating units IV can be esterified with suitable carboxylic and quinone diazide acids to form repeating units II and III. Alternatively the carboxylic and/or quinone diazide acids can be reacted with the alkyl acrylate and hydroxyalkyl acrylate units as copolymerization occurs.

As is well understood in the art the proportions of the various repeating units present in the final copolymer can be controlled by controlling the quantities of reactants present during copolymerization. In this regard it is noted that a preferred acrylic copolymer for the practice of this invention is formed by the copolymerization of hydroxyethyl methacrylate and methyl methacrylate, since these two compounds exhibit very similar rates of polymerization. Accordingly, the copolymers of hydroxyethyl methacrylate and methyl methacrylate are convenient to form, since they exhibit a relative proportion of repeating units comparable to the relative concentrations of the parent monomers during the polymerization reaction.

The radiation-sensitive copolymers of this invention are preferably utilized within the molecular weight range of from 5,000 to 20,000, although wider molecular weight ranges can be employed. Except as otherwise specified the molecular weights of these copolymers are given as the polystyrene equivalent number average molecular weights as determined by gelpermeation chromatography. As is well understood in the art the molecular weights and inherent viscosities of polymers are interrelated so that polymers can be usefully delineated in terms of either molecular weight or inherent viscosity. It is preferred that the inherent viscosities of the radiation-sensitive copolymers of this invention fall within the range of from 0.05 to 0.25. These inherent viscosities and others hereinafter referred to are, except as otherwise specified, determined using 1 gram of the copolymer per deciliter of 1,2-dichloroethane at 25°C.

Coating compositions containing the radiation-sensitive acrylic copolymers of this invention can be prepared by dispersing or dissolving the polymer in any suitable solvent or combination of solvents used in the art to prepare polymer dopes which are substantially unreactive toward the radiation-sensitive acrylic copolymers within the time period contemplated for maintaining the solvent and polymer in association and which are substantially incapable of degrading the substrate employed. Exemplary solvents include n-propanol, methyl ethyl ketone, 1,2-ethylene dichloride, 1-nitropropane, n-butylacetate, cyclohexane, hydroxyethyl acetate, cyclohexanone, methyl isobutyl ketone, toluene, diacetone alcohol, dioxane, isobutanol, acetonitrile, 2-ethoxyethanol, acetone, 4-butyrolactone, 2-methoxyethylacetate, 2-methoxyethanol and mixtures of these solvents with each other.

The concentrations of radiation-sensitive acrylic copolymer in the coating solutions are dependent upon the particular radiation-sensitive material employed as well as the support and the coating method employed. Particularly useful coatings are obtained when the coating solutions contain about 1 to 50 percent by weight, and preferably about 2 to 10 percent weight, of the radiation-sensitive acrylic copolymer. Higher concentrations, of course, give satisfactory results.

It will be recognized that additional components can be included in the coating formulation with the acrylic copolymers. For example, dyes or pigments may be included to obtain colored images to aid in recognition. Alizarine dyes and azo dyes are particularly suited. Pigments such as Victoria Blue (Color Index Pigment Blue I), Palomar Blue (Color Index Pigment Blue 15) and Watchung Red B (Color Index Pigment Red 48 ) may also be used. One method of providing particularly good recognition of image areas comprises the use of a print-out material with an inert dye. For example, a green colored inert dye such as Alizarine Cyanine Green GHN Conc. (Color Index Acid Green 25) in combination with an azide print-out material such as diazidostilbenedisulfonic acid disodium salt produces a green colored print-out on a blue-green background. Any other conventional print-out dye can be employed; however cyanine print-out dyes as disclosed in Mitchell U.S. Pat. No. 3,619,194, are preferred. Other components which can be advantageously included in the coating compositions are materials which serve to improve film formation, coating properties, adhesion of the coatings to the supports employed, mechanical strength, stability, etc.

It is recognized that the developability of plates formed according to our invention can be degraded if the radiation-sensitive coating composition is heated excessively during exposure, as can occur, for example, where repeated exposures are undertaken. To improve developability of plates which have been so heated it is desirable to include addenda such as boric acid, antioxidants (e.g. benzotriazole, hydroquinone, etc.), polyols (e.g. L(-)-rhamnose, glycerol, mannose, etc.), and carboxylic acids (e.g. oxalic acid, malonic acid, sebacic acid, adipic acid, succinic acid, phthalic acid, isophthalic acid, citric acid or butane tetracarboxylic acid etc.).

It is additionally recognized that aging the plates of the present invention can show some degradation of developability. To obviate or reduce any such tendency heavy metal salts of carboxylic acids can be incorporated. Exemplary heavy metal carboxylic salts include calcium, magnesium, strontium, cobalt, manganese and zinc salts of carboxylic acids such as zinc salicylate, zinc acetate, zinc propionate, zinc acetylacetonate, zinc formate, zinc benzoate and the like.

As is well understood in the art, the above addenda which together with the radiation-sensitive copolymers make up the radiation-sensitive layer of the final lithographic element are present in only a minor concentration. Individual addenda are typically limited to concentrations of less than about 5 percent by weight of the radiation-sensitive layer.

Particularly advantageous coating compositions contain at least one other film-forming polymeric resin in addition to the polymeric quinone diazide of this invention. These additional polymeric resins are typically not radiation sensitive, although mixtures of radiation-sensitive resins can be employed, and are usually selected from those resins which are soluble in the coating solvent. The amounts of resins employed will vary with the particular resin, useful results being obtained with coatings containing from 0.2 to 5.0 parts by weight of resin per part of polymeric quinone diazide of this invention. For printing plate applications 0.2 to 1.0 parts by weight of resin per part of polymeric quinone diazide is preferred.

Particularly useful film-forming resins which are not radiation sensitive are phenolic resins such as those known as novolac and resole resins and those described in Chapter XV of "Synthetic Resins in Coatings," H. P. Preuss, Noyes Development Corporation (1965), Pearl River, New York. The o-cresolformaldehyde resins, such as produced in accordance with German Pat. No. 281,454 are especially preferred.

These resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl)propane and the like. Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable phenolic resins are those which are insoluble in water and trichloroethylene but readily soluble in conventional organic solvents such as methyl ethyl ketone, acetone, methanol, ethanol, etc. Phenolic resins having a particularly desirable combination of properties are those which have an average molecular weight in the range between about 350 and 40,000.

Other suitable film forming resins include chlorinated biphenyls, modified rosin, copolymers of maleic anhydride with styrene or vinyl methyl ether, vinylidene chloride-acrylonitrile copolymers, terpolymers of vinylidene chloride and acrylonitrile with acrylic acid or itaconic acid, polyacrylic acids, methylmethacrylate-methacrylic acid copolymers, cellulose esters such as cellulose acetate stearate and the like.

Radiation-sensitive elements bearing layers of the polymeric quinone diazides can be prepared by coating the radiation-sensitive compositions from solvents onto supports in accordance with standard techniques, such as spray coating, dip coating, whirl coating, roller coating etc. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like.

Typical lithographic support materials which are useful in our invention include supports such as zinc, anodized aluminum, grained aluminum, copper and specially prepared metal and paper supports; superficially hydrolyzed cellulose ester films; polymeric supports such as polyolefins, polyesters, polyamide, etc.

The supports can be subcoated with known subbing such as copolymers and terpolymers of vinylidene chloride alone or with acrylic monomers such as acrylonitrile, methyl acrylate, etc., and unsaturated dicarboxylic acids such as itaconic acid, etc.; carboxymethyl cellulose; polyacrylamide; and similar polymeric materials.

The support can also carry a filter or antihalation layer composed of a dyed polymer layer which absorbs the exposing radiation after it passes through the radiation-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation.

The optimum coating thickness of the radiation-sensitive layer will depend upon such factors as the use to which the coating will be put, the particular radiation-sensitive polymer employed, and the nature of other components which may be present in the coating. Typical coating thicknesses can be from about 0.005 to 0.3 mils. or greater, with thicknesses of 0.025 to 0.1 mils. being preferred for printing plate applications.

After coating, the element is dried, optionally at an elevated temperature to remove residual solvent. The photographic elements employed in our invention are exposed by conventional methods, for example, through a transparency, to an imagewise pattern of actinic radiation which is preferably rich in ultraviolet light. Suitable sources include carbon arc lamps, mercury vapor lamps, fluorescent lamps, tungsten filament lamps, lasers, and the like. The exposed elements are then developed by flushing, soaking, swabbing, or otherwise treating the light-sensitive layers with a solvent or solvent system which exhibits a differential solvent action on the exposed and unexposed materials. These developing solvents preferably are basic solutions, such as aqueous alkalies, the lower alcohols and ketones, and aqueous solutions of the lower alcohols and ketones. The alkaline strength of the developer is governed by the particular polymeric quinone diazide used, other resins which may be employed and the proportions of the various components. The developer can also contain dyes and/or pigments and hardening agents. The developed image is rinsed with distilled water and dried optionally at elevated temperatures. The resulting images may then be treated in any known manner consistent with their intended use, such as treatment with desensitizing etches, plate lacquers, etc. when used as a printing plate or treatment with acidic or basic etchants or plating baths when used as a resist.

The following specific embodiments further illustrate this invention.

A solution of a monomer capable of forming repeating units (I), in this case methyl methacrylate, and a monomer capable of forming repeating units (IV), 2-hydroxyethyl methacrylate together with polymerization initiator 2,2'-azobis(2-methylpropionitrile) in a monomer solvent is added to a reaction solvent maintained at reflux temperature under a nitrogen atmosphere. The mixture is heated at reflux under a nitrogen blanket. The copolymers so formed are not radiation sensitive, since they have not yet been esterified to introduce repeating units (II) and (III). These polymers are accordingly identified as starting copolymers. The preparation parameters for the various starting polymers are set forth in Table I. DCE as used herein stands for 1,2-dichloroethane while MEK stands for methyl ethyl ketone. Starting copolymer 8317B is prepared using 2-hydroxyethyl acrylate instead of 2-hydroxyethyl methacrylate. In Table I where separate monomer and reaction solvents are not listed all materials were added together before heating.

TABLE I

| Starting Copolymer Prepared | Starting Monomers - grams (I) | (IV) | Initiator grams | Monomer Solvent / Reaction Solvent | Heating Time Hours |
|---|---|---|---|---|---|
| 6931 | 275 | 162.5 | 8.4 | DCE-330 ml / DCE-1670 ml | 20 |
| 7525 | 300 | 130 | 4.2 | DCE-330 ml / DCE-1680 ml | 16 |
| 7822A | 1458 | 542 | 20 | MEK-3000 g / MEK-3000 g | 16 |
| 7822B | 2803 | 1041 | 57.8 | MEK-11,534 ml / N.A. | N.A. |
| 8218 | 175 | 50 | 2.25 | DCE-1015 ml | 17 |
| 8317A | 333 | 86.7 | 4.2 | DCE-333 ml / DCE-1670 ml | 16 |
| 8317B | 100 | 23.2* | 1.2 | DCE-100 ml / DCE-500 ml | 18 |
| 8515 | 170.2 | 40.5 | 2.09 | MEK-790 ml | 18 |
| 8713 | 162.7 | 33.8 | 1.96 | MEK-735 ml | 18 |
| 8911 | 400.5 | 67.6 | 9.31 | MEK-1745 ml | 18 |
| 9109 | 500.6 | 67.6 | 11.31 | MEK-2125 ml | 18 |

*2-hydroxyethyl acrylate

The starting copolymers so formed can be isolated by addition to a nonsolvent, washing and drying. As is evident from Table II, in most instances it is convenient to introduce the acid chloride to be esterified with the starating copolymer into triethanolamine and the reaction mixture that is produced in preparing the starting copolymer. A radiation-sensitive acid chloride and an acid chloride which is not radiation-sensitive are introduced in successive stages. In this instance the radiation-sensitive acid chloride is 1,2-naphthoquinone-2-diazide-5-sulfonyl chloride while the acid chloride which is not radiation-sensitive is benzoyl chloride. The first stage of the esterification reaction during which only the radiation-sensitive acid chloride is present is allowed to run to completion while stirring. Then the acid chloride which is not radiation-sensitive is introduced and stirring continued until esterification is complete. The mixture is allowed to come to room temperature and the triethylamine hydrochloride produced is removed by filtration. The radiation-sensitive copolymer formed is isolated from the filtrate by treatment with a nonsolvent, collected, washed and dried. The parameters for the preparation of individual radiation-sensitive copolymers are set forth in Table II.

TABLE II

| Starting Copolymer Reference-Amount (g) | Reaction Solvent Isolation Solvent Name – Amount | Triethylamine (g) | Light Sens./Non-light Sens. Acid chloride-g | Reaction Time-Temp. 1st Stage 2nd Stage | Radiation-Sensitive Copolymer |
|---|---|---|---|---|---|
| Entire Reaction Mixture 6931 | Isopropyl alcohol-17 l. | 150 | 301/17.5 | 4 hrs.-5°C 16 hrs.-5°C | 69280300 |
| Entire Reaction Mixture 7525 | Isopropyl alcohol | 120 | 241/14.0 | 4 hrs.-5°C 16 hrs.-5°C | 75220300 |
| 7850 g of Reaction Mixture 7822A | Water - 87 l. | 238 | 527/None | 16 hrs.-2°C | 78080014 |
| 1538 g of Reaction Mixture 7822B | Water - 15.2 l. | 51 | 129/33.6 | 16 hrs.-5°C 4 hrs.-5°C | 78130702 |
| Entire Reaction Mixture 8218 | Isopropyl Alcohol - 10 l. | 46.6 | 92.8/5.4 | 4 hrs.-0°C 16 hrs.-0°C | 82160200 |
| Entire Reaction Mixture 8317A | Isopropyl Alcohol 1,2-dichloroethane-600 ml. | 81 | 161/9.3 | 4 hrs.-5°C 16 hrs.-5°C | 83150200A |
| 8317B - 80 g | Isopropyl Alcohol - 6 l. | 14.1 | 31.4/2.0 | 4 hrs.-0°C 16 hrs.-5°C | 83150200B |
| 819.3 g of Reaction Mixture 8515 | | 24.5 | 54.9/2.6 | 15.5 hrs.-7°C 5 hrs.-7°C | 85100104 |
| 756.7 g of Reaction Mixture 8713 | | 27.2 | 59.1/3.45 | 15.5 hrs.-7°C 5.5 hrs.-7°C | 87120100 |
| 1852 g of Reaction Mixture 8911 | Isopropyl Alcohol | 55.1 | 133/None | 16 hrs.-6°C | 89110000 |
| 2257 g of Reaction Mixture 9109 | Isopropyl Alcohol | 55.2 | 133/None | 16 hrs.-7°C | 91090000 |

The yields, inherent viscosities and molecular weights for certain of these radiation-sensitive copolymers are set forth in Table III. The molecular weights and inherent viscosities are determined as previously discussed, except where otherwise noted. The molecular weights and inherent viscosities of all radiation-sensitive copolymers produced are within the useful ranges set forth above.

TABLE III

| Radiation-Sens. Copolymer | Inherent Viscosity | Molecular Weight | Yield (grams) |
|---|---|---|---|
| 69280300 | 0.13 | N.R.* | 543 |
| 75220300 | 0.14 | N.R.* | 5370 |
| 78080014 | 0.16 | N.R.* | 1925 |
| 78130702 | 0.11 | 9,100 | 523 |
| 82160200 | 0.20 | 26,700 | 255 |
| 83150200A | 0.20 | N.R.* | 508 |
| 89110000 | 0.16 | 7,100 | 575.3 |
| 91090000 | 0.10 | 8,300 | 669.1 |

* Not determined

The proportions of the repeating units are set forth as mole percentages in Table IV. The repeating units are categorized as repeating units (I), (II), (III) and (IV) in accordance with the applicable generic formulas previously set forth. Included also in Table IV is copolymer 50450005. This copolymer was prepared similarly as the remaining copolymers, significantly differing only in the concentrations of the repeating units present.

TABLE V

| | |
|---|---|
| Radiation-Sensitive Copolymer | 6.0 g |
| Alnovol 429K* | 3.0 g |
| Alizarine Cyanine Green (GHN conc.) | 0.3 g |
| 2-Methoxyethanol | 34.0 ml |
| 2-Methoxyethyl Acetate | 34.0 ml |
| Methyl Ethyl Ketone | 27.0 ml |
| 1,2-Dichloroethane | 42.0 ml |
| Diacetone alcohol | 4.0 ml |

*Trademark of American Hoechst Corp. and Chemische Werke (West Germany) for cresol formaldehyde resin.

The radiation-sensitive copolymers and the plates which they form are insensitive to yellow and higher wavelength light. Accordingly, the conventional practice of preparing and handling the copolymers and plates under yellow light is to be assumed unless some other exposure is specified.

The radiation-sensitive compositions are formed into lithographic plates by whirl-coating onto grained, phosphoric acid anodized aluminum supports subbed with polyacrylamide. The plates after formation are incubated for 20 hours at 60°C to simulate the effects of storage in practical use.

The plates are exposed imagewise to a positive transparency for 4 minutes with a carbon arc exposing unit at 2000 foot-candles. The plates are swab developed with an aqueous alkaline solution of the composition set forth in Table VI.

TABLE IV

| Radiation-Sensitive Copolymer | Repeating Units – mole % (I) | (II) | (III) | (IV) | Developability | press Performance | Press Wear |
|---|---|---|---|---|---|---|---|
| 50450005 | 50 | 45 | None | 5 | Poor | Scum | .R.* |
| 69280300 | 68.8 | 28 | 3.1 | 0.1 | Poor | Scum | Poor |
| 75220300 | 75 | 22.5 | 2.5 | None | Fair | Slight scum | Fair |
| 78080014 | 77.8 | 10.6 | None | 11.6 | Fair | Scum | ood |
| 78130702 | 77.8 | 12.1 | 6.1 | 4.0 | Good | No scum | ood |
| 82160200 | 81.8 | 16.3 | 1.9 | None | Good | No scum | ood |
| 83150200A | 83.3 | 15 | 1.7 | None | Good | No scum | ood |
| 83150200B | 83.3 | 15.0** | 1.7** | None | Good | No scum | ood |
| 85100104 | 85 | 10 | 1 | 4 | Good | No scum | ood |
| 87120100 | 86.3 | 12.1 | 1.3 | 0.3 | Good | No scum | ood |
| 89110000 | 89 | 11 | None | None | Poor | No scum | ood |
| 91090000 | 91 | 9 | None | None | Poor | No scum | Good |

* Not run
** Prepared using 2-hydroxyethyl acrylate

The radiation-sensitive copolymers set forth in Table IV are formed into lithographic plates utilizing the following procedure: Radiation-sensitive compositions are prepared of the ingredients specified in Table V and differing only in terms of the particular radiation-sensitive copolymer chosen.

TABLE VI

| | | |
|---|---|---|
| Triethanolamine | 10 | ml |
| Isopropyl Alcohol | 30 | ml |
| Sodium Hydroxide | 0.5 | g |
| Water | 60 | ml |

With plates that are characterized as having poor developability in Table IV, it is very difficult to remove all of the radiation-sensitive layer from exposed areas without severely damaging the radiation-sensitive layer in image (unexposed) areas. With plates of fair developability it is difficult to completely remove all the exposed polymer. With plates of good developability, the polymer is readily removed from exposed areas during development.

The processed plates are subjected to an accelerated press wear test by placing shims under either the printing plate or the offset blanket on the printing press to produce an abnormally high plate-to-blanket pressure. Wear is increased by a factor of at least 2.5—that is, a plate which will normally run 100,000 impressions under practical press conditions lasts no longer than 40,000 impressions under the present accelerated wear conditions. In view of the accelerated wear conditions employed, the wear characteristics are categorized as follows:

| | |
|---|---|
| Poor | 40,000 impressions |
| Fair | 40,000 to 60,000 impressions |
| Good | 60,000 impressions |

Press wear characteristics are reported in Table IV employing these criteria.

Press performance characteristics are reported in Table IV in terms of the scum observed in background areas during printing. This is a measure of the degree to which ink is deposited in background (exposed) areas of the plate. While plates exhibiting slight scum are useful in terms of producing a visible printed image, it is generally preferred that a plate be entirely free of scum for most printing applications.

In looking at Table IV it can be seen that plates incorporating radiation-sensitive copolymers containing less than 75 percent of repeating units (I) exhibit poor press wear. Good press wear characteristics require about 78 percent of repeating units (I). Since increasing amounts of repeating units (I) improve this plate characteristic, there is no real maximum proportion of repeating units (I) insofar as press wear is concerned. However, very high proportions of repeating units (I) do not allow for sufficient quantities of the remaining repeating units to be present to adequately support developability. As a practical matter repeating units (I) should not be incorporated in a proportion greater than 87 percent.

Looking further at Table IV it can be seen that press performance is adversely affected when repeating units (IV) are present in the polymer and no repeating units (III) are present. At the same time scumming is observed even with repeating units (III) and (IV) both present when repeating units (II) are present in concentrations above 22.5 percent. With repeating unit (II) concentrations below 22 percent and as little as 1 percent of repeating units (III) being present, up to 4 percent of repeating units (IV) can be included without adverse effect on the plates.

Using the proper proportions of repeating units (II) and (III) is illustrated in Table IV to be essential to achieving good developability. Without repeating units (II) being present the plates are not radiation-sensitive and are not developable at all. However, it is surprising that with very high concentrations of repeating units (II) above 22.5 percent the developability of the plates is poor. With 22.5 percent of repeating units (II) and repeating units (III) also present fair developability is exhibited. With only 10 percent repeating units (II) and only 1 percent repeating units (III) the plates exhibit good developability. On the other hand, if the concentration of repeating units (II) are left at about 10 percent and all of repeating units (III) are absent, developability is poor.

Table IV then demonstrates superior lithographic plates of long running characteristics can be formed by using a radiation-sensitive copolymer according to this invention in which from 75 to 87 percent of the repeating units of the copolymer are alkyl acrylate units (I), from 10 to 22 percent of the repeating units are acryloyloxyalkyl quinone diazide acid ester units (II), from 1 to 7 percent of the repeating units are acryloyloxyalkyl carboxylate units (III) and up to 4 percent of the repeating units are hydroxyalkyl acrylate units (IV). Preferred copolymers are those set forth above in which repeating units (I) are present in a concentration of at least 78 percent and repeating units (II) are limited to about 17 percent.

To further illustrate the adverse effect of hydroxyl group containing repeating units in radiation-sensitive copolymers lacking repeating units (II) and to illustrate the tolerance of these hydroxyl containing repeating units when repeating units (III) are present, two different radiation-sensitive copolymers are prepared and formed into lithographic plates according to the general procedures above described. The repeating units (I), (II), (III) and (IV) are identical to those of the copolymers of Table IV and the plates do not significantly differ from those of Table IV, being prepared in the same general manner. The plate compositions and comparative performances are set forth in Table VII.

TABLE VII

| Plate No. | Radiation-Sensitive Copolymer (I) | (II) | (III) | (IV) | Performance On press |
|---|---|---|---|---|---|
| A | 83.4 | 15 | None | 1.6 | Slight scum |
| B | 83.4 | 11.8 | 1.6 | 3.2 | Excellent No scum |

It can be seen from Table VII that 1.6 percent repeating units (IV) present in the copolymer a slight scum is present when the plate is placed in service. On the other hand, excellent press performance is achieved with twice the proportion of repeating units (IV) when repeating units (III) are also present. This dramatically illustrates Applicants' discovery that radiation-sensitive copolymers containing repeating units (III) exhibit superior press performance and can tolerate significant quantities of repeating units (IV) without adverse effects on plate performance.

To illustrate this invention further a number of additional plates are prepared according to this invention similar to those set forth in Table IV. These plates, while formed of similar copolymers and by essentially similar techniques, are formed using the following composition in lieu of that set forth in Table V:

TABLE VIII

| | | |
|---|---|---|
| Radiation-Sensitive Copolymer | 6.0 | g |
| Alnovol 429K | 3.0 | g |
| Alizarine Cyanine Green | 0.1 | g |
| 2-Methoxyethanol | 34.0 | ml |
| 2-Methoxyethyl acetate | 34.0 | ml |
| Methyl Ethyl Ketone | 27.0 | ml |
| 1,2-Dichloroethane | 42.0 | ml |
| Diacetone alcohol | 4.0 | ml |
| Zinc Salicylate | 0.2 | g |
| Boric Acid | 0.3 | g |
| Benzotriazole | 0.2 | g |
| L(-)-Rhamnose | 0.2 | g |
| 1,3,3-trimethyl-1'-(N-methylanilino)-4',6'-di-p- tolyl-indo-2'-pyrido carbocyanine perchlorate | 0.1 | g |

The plates on exposure exhibit a distinctly visible print-out image on a green background attributable to the presence of the cyanine print-out dye. When the plates are successively re-exposed without allowing intervening periods for cooling, the plates remain readily developable, even though corresponding plates without the combination of boric acid, benzotriazole and L(-)-rhamnose become more difficult to develop when exposed under these conditions.

Further employing procedures similar to those used in forming the radiation-sensitive copolymers and plates within the purview of this invention as set forth in Table IV, radiation-sensitive copolymers incorporating 83.4 percent methyl methacrylate repeating units, 15 percent methacryloyloxyethyl naphthoquinone diazide sulfonic acid ester repeating units and 1.6 percent 2-hydroxyethyl methacrylate repeating units esterified with p-bromobenzoyl chloride, acetyl chloride and myristyl chloride, respectively, in place of benzoyl chloride are noted to produce excellent lithographic plates. Plates formed of these copolymers exhibit good developability, no scum and good press wear characteristics.

While the radiation-sensitive copolymers of this invention have been specifically disclosed as useful in forming lithographic plates, it is to be understood that these copolymers can be used for other purposes. For example, these copolymers, because of their radiation sensitivity can also be used as photoresists using techniques well known to those skilled in the art.

This invention has been described in detail with particular reference to preferred embodiments thereof, but it will be understood that variations and modifications can be effected within the spirit and scope of the invention.

We claim:

1. In a radiation-sensitive element capable of producing a positive image upon exposure to actinic radiation and subsequent treatment with a basic solution in which said element is comprised of a support bearing a radiation-sensitive acrylic vinyl copolymer, the improvement in which, on a mole basis, from 75 to 87 percent of the repeating units of said copolymer are alkyl acrylate units, from 10 to 22 percent of said repeating units are acryloyloxyalkyl quinone diazide acid ester units, from 1 to 7 percent of said repeating units are acryloyloxyalkyl carboxylate units and 0 to 4 percent of said repeating units are hydroxylalkyl acrylate units.

2. A radiation-sensitive element according to claim 1 in which said alkyl acrylate units are present in a proportion of from 78 to 87 percent.

3. A radiation-sensitive element according to claim 1 in which said acryloyloxyalkyl quinone diazide acid ester units are present in a proportion of from 10 to 17 percent.

4. A radiation-sensitive element according to claim 1 in which said radiation-sensitive copolymer exhibits an inherent viscosity in the range of from 0.05 to 0.25.

5. A radiation-sensitive element according to claim 1 in which said radiation-sensitive copolymer exhibits a molecular weight in the range of from 5000 to 20,000.

6. A radiation-sensitive element according to claim 1 in which said element incorporates a dye.

7. A radiation-sensitive element according to claim 1 in which said element incorporates a print-out dye.

8. A radiation-sensitive element according to claim 1 in which said element incorporates a cyanine print-out dye.

9. A radiation-sensitive element according to claim 1 in which said element incorporates a minor proportion of an acid.

10. A radiation-sensitive element according to claim 1 in which said element incorporates a minor proportion of a carboxylic acid.

11. A radiation-sensitive element according to claim 1 in which said element incorporates a minor proportion of boric acid.

12. A radiation-sensitive element according to claim 1 in which said element incorporates from 0.2 to 1.0 part by weight of a film-forming resin per part of radiation-sensitive copolymer.

13. In a radiation-sensitive element capable of producing a positive image upon exposure to actinic radiation and subsequent treatment with a basic solution in which said element is comprised of a support bearing a radiation-sensitive layer incorporating a radiation-sensitive copolymer, the improvement in which, on a mole basis, from 75 to 87 percent of the repeating units of said copolymer are repeating units (I)

(I)

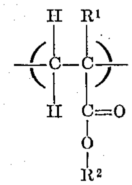

from 10 to 22 percent of said repeating units are repeating units (II)

(II)

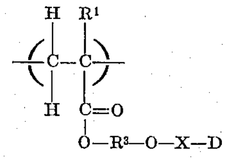

from 1 to 7 percent of said repeating units are repeating units (III)

(III)

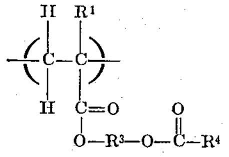

and 0 to 4 percent of said repeating units are repeating units (IV)

(IV) 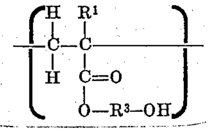

wherein, $R^1$ is methyl or hydrogen, $R^2$ is an alkyl radical having from 1 to 6 carbon atoms, $R^3$ is an alkylene radical having from 2 to 6 carbon atoms, $R^4$ is a hydrocarbon or halohydrocarbon having up to 20 carbon atoms, O—X is an acid ester group, and D is a quinone diazide group.

14. A radiation-sensitive element according to claim 13 in which said repeating units (I) are methyl methacrylate repeating units.

15. A radiation-sensitive element according to claim 13 in which said repeating units (II) are repeating units of 2-hydroxyethyl methacrylate esterified with naphthoquinone diazide acid halide.

16. A radiation-sensitive element according to claim 13 in which said repeating units (III) are methacryloyloxyethylbenzoate units.

17. A radiation-sensitive element according to claim 13 in which said repeating units (IV) are repeating units of 2-hydroxyethyl methacrylate.

18. A radiation-sensitive element capable of producing a positive image upon exposure to actinic radiation and subsequent treatment with a basic solution in which said element is comprised of a support bearing a radiation-sensitive layer incorporating a radiation-sensitive copolymer, the improvement in, on a mole basis, from 78 to 87 percent of the repeating units of said copolymer are methyl methacrylate repeating units, from 10 17 percent of said repeating units are acryloyloxyethyl naphthoquinone diazide acid ester units, from 1 to 7 percent of said repeating units are acryloyloxyethyl carboxylate repeating units and 0 to 4 percent of said repeating units 2-hydroxyethyl acrylate units.

19. A radiation-sensitive element according to claim 18 in which said acryloyloxyethyl carboxylate repeating units are acryloyloxyethyl benzoate repeating units.

20. A radiation-sensitive element according to claim 18 in which said radiation-sensitive layer incorporates a minor proportion of boric acid, benzotriazole and L(-)-rhamnose.

21. A radiation-sensitive element according to claim 18 in which said radiation-sensitive layer incorporates a minor proportion of a cyanine print-out dye.

22. A radiation-sensitive composition comprised of a radiation-sensitive copolymer consisting essentially of, on a molar basis, from 75 to 87 percent alkyl acrylate units, from 10 to 22 percent acryloyloxyalkyl quinone diazide acid ester units, from 1 to 7 percent acryloyloxyalkyl carboxylate units and from 0 to 4 percent hydroxylalkyl acrylate units in which said composition is a radiation-sensitive coating composition, said radiation-sensitive copolymer is present in a concentration of from 1 to 50 percent by weight and said composition includes a solvent for said copolymer.

23. A radiation-sensitive composition according to claim 22 in which said composition additionally includes a dye.

24. A composition according to claim 22 in which said composition additionally includes a minor proportion of a printout dye.

25. A radiation-sensitive composition according to claim 22 in which said composition additionally includes less than 5 percent by weight of a carboxylic acid.

26. A radiation-sensitive composition according to claim 22 in which said composition additionally includes less than 5 percent by weight of a mixture of boric acid, benzotriazole and L(-)-rhamnose.

27. A radiation-sensitive composition according to claim 22 in which said composition additionally includes from 0.2 to 5.0 parts by weight of a film-forming resin per part of said radiation-sensitive copolymer.

28. A radiation-sensitive composition comprised from 1 to 50 percent by weight of a radiation-sensitive copolymer consisting essentially of, on a mole basis, from 75 to 87 percent of repeating units (I)

(I) 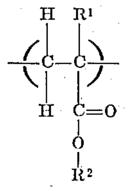

from 10 to 22 percent of repeating units (II)

(II) 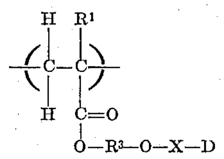

from 1 to 7 percent of repeating units (III)

(III) 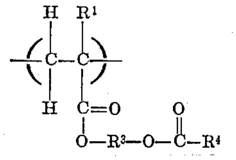

0 to 4 percent of repeating units IV (IV) 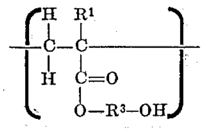

wherein $R^1$ is methyl or hydrogen, $R^2$ is an alkyl radical having from 1 to 6 carbon atoms, $R^3$ is an alkylene radical having from 2 to 6 carbon atoms, $R^4$ is a hydrocarbon or halohydrocarbon having up to 20 carbon atoms, O—X is an acid ester group, and D is a quinone diazine group, and a solvent for said copolymer.

29. A radiation-sensitive composition according to claim 28 in which said repeating units (I) are methyl methacrylate repeating units.

30. A radiation-sensitive composition according to claim 28 in which said repeating units (II) are methacryloyloxyethyl naphthoquinone diazide sulfonic acid ester units.

31. A radiation-sensitive composition according to claim 28 in which said repeating units (III) are methacryloyloxyethyl benzoate repeating units.

32. A radiation-sensitive composition according to claim 28 in which said repeating units (III) are methacryloyloxyethyl p-bromobenzoate repeating units.

33. A radiation-sensitive composition according to claim 28 in which said repeating units (III) are methacryloyloxyethyl acetate repeating units.

34. A radiation-sensitive composition according to claim 28 in which said repeating units (IV) are 2-hydroxyethyl methacrylate repeating units.

35. A radiation-sensitive composition according to claim 28 in which said composition additionally includes from 0.2 to 5.0 parts by weight of a film-forming resin per part of said radiation-sensitive copolymer.

36. A radiation-sensitive composition according to claim 35 in which said film-forming resin is a phenol-formaldehyde resin.

* * * * *

UNITED STATES PATENT AND TRADEMARK OFFICE

CERTIFICATE OF CORRECTION

PATENT NO. : 3,859,099

DATED : January 7, 1975

INVENTOR(S) : Constantine C. Petropoulos, Joseph A. Arcesi and Raymond W. Ryan

It is certified that error appears in the above-identified patent and that said Letters Patent are hereby corrected as shown below:

Column 1, lines 15-16, "pho- toresists," should read ---pho- toresists.---; and, line 21, "ineract" should read ---interact---.

Column 2, line 55, "radiationsensitivity" should read --- radiation-sensitivity ---; and, line 60, "radiationsensitive" should read --- radiation-sensitive ---.

Column 3, line 40, "naphthoquinone 1-" should read ---naphthoquinone-1- ---.

Column 4, line 40, the formula should read

--- (IV) 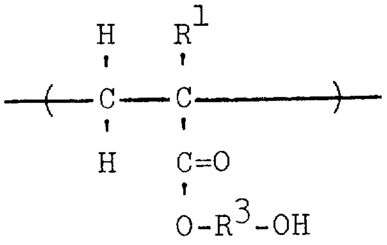 ---

Column 5, line 23, "gelpermeation" should read --- gel-permeation---.

Column 9, lines 25-26, "starating" should read ---starting---.

Column 11, Table IV, the last column under "Press Wear" should read --- N.R.[x], Poor, Fair, Good, Good, Good, Good, Good, Good, Good, Good, Good ---.

UNITED STATES PATENT AND TRADEMARK OFFICE

CERTIFICATE OF CORRECTION

PATENT NO. : 3,859,099

DATED : January 7, 1975

INVENTOR(S) : Constantine C. Petropoulos, Joseph A. Arcesi and Raymond W. Ryan

It is certified that error appears in the above-identified patent and that said Letters Patent are hereby corrected as shown below:

Column 14, line 26, "(II)" should read ---(III)---; and, line 50, after "that" insert ---with---.

Column 17, line 3, the formula should read

--- (IV) 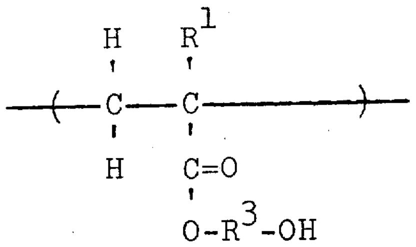 ---;

and, line 42, after "10" insert ---to---.

Column 18, line 60, the formula should read

--- (IV) 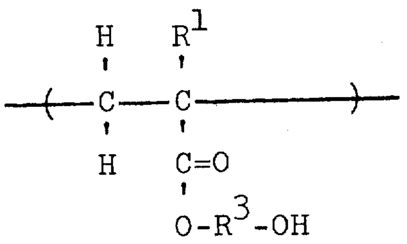 ---

Column 19, line 6, "diazine" should read ---diazide---.

Signed and Sealed this

*fourth* Day of *May 1976*

[SEAL]

*Attest:*

RUTH C. MASON
*Attesting Officer*

C. MARSHALL DANN
*Commissioner of Patents and Trademarks*